United States Patent
Liu et al.

(10) Patent No.: US 10,312,356 B1
(45) Date of Patent: Jun. 4, 2019

(54) HETEROJUNCTION BIPOLAR TRANSISTORS WITH MULTIPLE EMITTER FINGERS AND UNDERCUT EXTRINSIC BASE REGIONS

(71) Applicant: GLOBALFOUNDRIES Inc., Grand Cayman (KY)

(72) Inventors: Qizhi Liu, Lexington, MA (US); Vibhor Jain, Essex Junction, VT (US); James W. Adkisson, Jericho, VT (US); Sarah McTaggart, Essex Junction, VT (US); Mark Levy, Williston, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/013,363

(22) Filed: Jun. 20, 2018

(51) Int. Cl.
*H01L 31/0328* (2006.01)
*H01L 29/737* (2006.01)
*H01L 29/08* (2006.01)
*H01L 29/10* (2006.01)
*H01L 29/165* (2006.01)
*H01L 29/423* (2006.01)
(Continued)

(52) U.S. Cl.
CPC .... *H01L 29/7371* (2013.01); *H01L 21/02532* (2013.01); *H01L 21/30604* (2013.01); *H01L 21/76224* (2013.01); *H01L 29/0649* (2013.01); *H01L 29/0813* (2013.01); *H01L 29/0817* (2013.01); *H01L 29/0821* (2013.01); *H01L 29/1004* (2013.01); *H01L 29/165* (2013.01); *H01L 29/42304* (2013.01); *H01L 29/66242* (2013.01); *H01L 21/02164* (2013.01); *H01L 21/02271* (2013.01); *H01L 21/26513* (2013.01); *H01L 21/3065* (2013.01); *H01L 21/31053* (2013.01)

(58) Field of Classification Search
CPC ............. H01L 29/7371; H01L 29/0649; H01L 29/0813; H01L 29/0817; H01L 29/0821; H01L 29/1004; H01L 29/165; H01L 29/42304; H01L 29/66242; H01L 21/02532; H01L 21/30604; H01L 21/76224; H01L 21/02164; H01L 21/02271; H01L 21/26513; H01L 21/3065; H01L 21/31053
USPC ........................................................ 257/197
See application file for complete search history.

(56) References Cited

U.S. PATENT DOCUMENTS 8,067,290 B2   11/2011   Boeck et al.
8,129,234 B2 *  3/2012   Wallner ............... H01L 27/0623
                                                              257/E21.696
(Continued)

*Primary Examiner* — Tu-Tu V Ho
(74) *Attorney, Agent, or Firm* — Thompson Hine LLP

(57) ABSTRACT

Device structures and fabrication methods for heterojunction bipolar transistors. Trench isolation regions are arranged to surround a plurality of active regions, and a collector is located in each of the active regions. A base layer includes a plurality of first sections that are respectively arranged over the active regions and a plurality of second sections that are respectively arranged over the trench isolation regions. The first sections of the base layer contain single-crystal semiconductor material, and the second sections of the base layer contain polycrystalline semiconductor material. The second sections of the base layer are spaced in a vertical direction from the trench isolation regions to define a plurality of cavities. A plurality of emitter fingers are respectively arranged on the first sections of the base layer.

20 Claims, 11 Drawing Sheets

(51) Int. Cl.
*H01L 21/762* (2006.01)
*H01L 29/66* (2006.01)
*H01L 21/306* (2006.01)
*H01L 21/02* (2006.01)
*H01L 29/06* (2006.01)
H01L 21/3065 (2006.01)
H01L 21/3105 (2006.01)
H01L 21/265 (2006.01)

(56) References Cited

U.S. PATENT DOCUMENTS

| | | |
|---|---|---|
| 9,070,734 B2 | 6/2015 | Camillo-Castillo et al. |
| 9,159,817 B2 | 10/2015 | Camillo-Castillo et al. |
| 9,202,900 B2 | 12/2015 | Adkisson et al. |
| 9,245,951 B1 | 1/2016 | Camillo-Castillo et al. |
| 9,318,551 B2 | 4/2016 | Camillo-Castillo et al. |
| 9,368,608 B1 | 6/2016 | Camillo-Castillo et al. |

* cited by examiner

HETEROJUNCTION BIPOLAR TRANSISTORS WITH MULTIPLE EMITTER FINGERS AND UNDERCUT EXTRINSIC BASE REGIONS

BACKGROUND

The invention relates generally to semiconductor device and integrated circuit fabrication and, in particular, to device structures and fabrication methods for heterojunction bipolar transistors.

A bipolar junction transistor is a three-terminal electronic device that includes an emitter, a collector, and an intrinsic base arranged between the emitter and collector. In an NPN bipolar junction transistor, the emitter and collector may be composed of n-type semiconductor material, and the intrinsic base may be composed of p-type semiconductor material. In a PNP bipolar junction transistor, the emitter and collector may be composed of p-type semiconductor material, and the intrinsic base may be composed of n-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which at least two of the collector, emitter, and intrinsic base are composed of semiconductor materials with different energy bandgaps, which creates heterojunctions. For example, the collector and/or emitter of a heterojunction bipolar transistor may be composed of silicon, and the base of a heterojunction bipolar transistor may be composed of silicon germanium (SiGe), which is characterized by a narrower band gap than silicon.

In some applications such as power amplifiers, the emitter of a heterojunction bipolar transistor may include multiple emitter fingers. An extrinsic base region is arranged between each pair of emitter fingers. These extrinsic base regions contribute to the parasitic capacitance of the device structure, which may adversely impact device performance.

Improved structures and fabrication methods for heterojunction bipolar transistors are needed.

SUMMARY

In an embodiment of the invention, a device structure is provided for a heterojunction bipolar transistor. The device structure includes a plurality of trench isolation regions arranged to surround a plurality of active regions, a collector in each of the active regions, and a base layer including a plurality of first sections that are respectively arranged over the active regions and a plurality of second sections that are respectively arranged over the trench isolation regions. The first sections of the base layer contain single-crystal semiconductor material, and the second sections of the base layer contain polycrystalline semiconductor material. The second sections of the base layer are spaced in a vertical direction from the trench isolation regions to define a plurality of cavities. A plurality of emitter fingers are respectively arranged on the first sections of the base layer.

In an embodiment of the invention, a method of fabricating a heterojunction bipolar transistor is provided. The method includes forming a plurality of trench isolation regions surrounding a plurality of active regions that each include a collector, and forming a base layer that includes a plurality of first sections containing single-crystal semiconductor material that are respectively arranged over the active regions and a second plurality of sections containing polycrystalline semiconductor material that are respectively arranged over the trench isolation regions. The method further includes removing a first semiconductor layer of each of the second sections of the base layer selective to a second semiconductor layer of each of the second sections of the base layer to define a plurality of cavities that are arranged in a vertical direction between the second semiconductor layer and the trench isolation regions. The method further includes forming a plurality of emitters respectively arranged on the first sections of the base layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 4A is a top view of the etch mask covering the device structure of FIG. 4 and in which FIG. 4 is taken generally along line 4-4.

FIG. 5A is a top view of the device structure in which FIG. 5 is taken generally along line 5-5.

DETAILED DESCRIPTION

Figure 1:
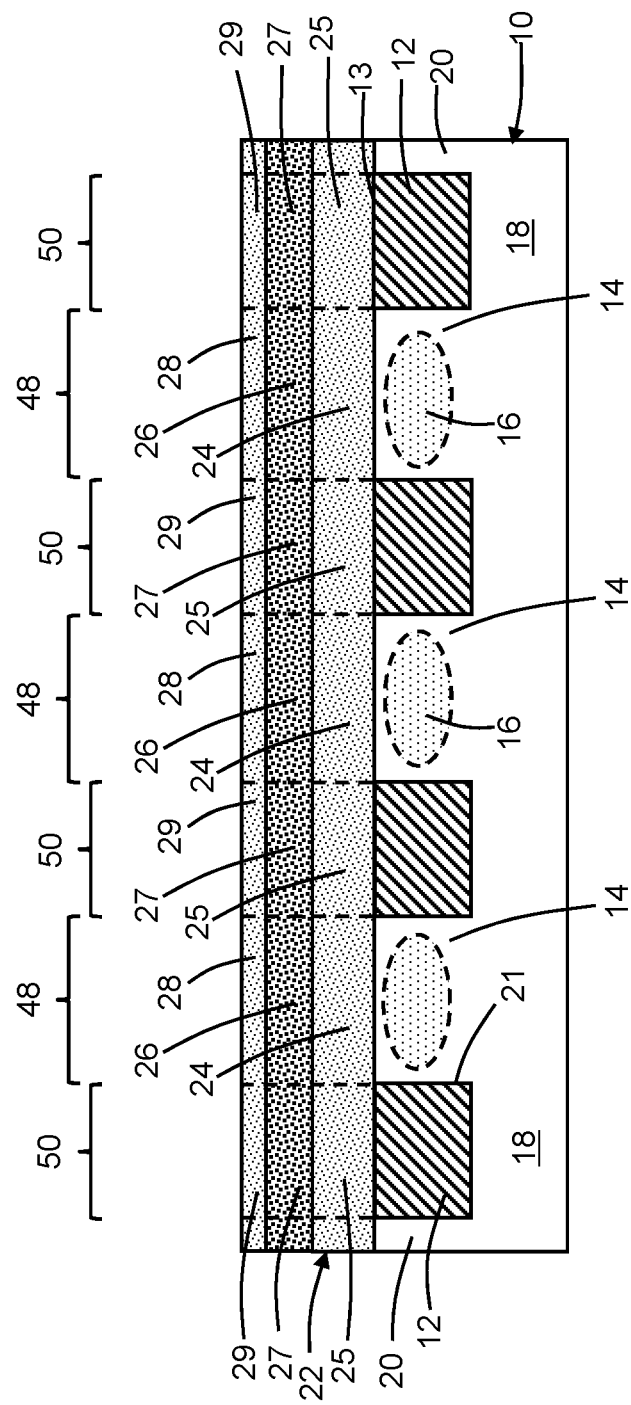
FIG. 1-6 are cross-sectional views of a device structure at successive fabrication stages of a processing method in accordance with embodiments of the invention.

With reference to FIG. 1 and in accordance with embodiments of the invention, a substrate 10 may be comprised of a single-crystal semiconductor material, such as silicon (Si). The single-crystal semiconductor material of the substrate 10 may include an epitaxial layer at its top surface, and the epitaxial layer may be doped with an electrically-active dopant to alter its electrical conductivity. For example, an epitaxial layer of single-crystal silicon may be grown on the substrate 10 by an epitaxial growth process, and may be doped during epitaxial growth with an n-type dopant from Group V of the Periodic Table (e.g., phosphorus (P), arsenic (As), and/or antimony (Sb)) to provide n-type conductivity.

Trench isolation regions 12 are formed in the substrate 10 and are arranged to surround active regions 14 of the substrate 10. The trench isolation regions 12 may be formed by a shallow trench isolation (STI) technique that relies on a lithography and dry etching process to define trenches in the substrate 10, deposits a dielectric material to fill the trenches, and planarizes the dielectric material using chemical mechanical polishing (CMP). The dielectric material may be, for example, an oxide of silicon (e.g., silicon dioxide ($SiO_2$)) that is deposited by chemical vapor deposition (CVD).

A section of a collector 16 is arranged in each active region 14 and may constitute all or a portion of the respective active region 14. The electrical conductivity of the collector 16 may be elevated relative to the substrate 10 by, for example, an ion implantation of an electrically-active dopant, such as an n-type dopant, into a central portion of the active region 14. A subcollector 18 extends laterally in the substrate 10 beneath the outer trench isolation region 12 in order to couple the collectors 16 with a collector contact region 20, which is arranged outside of the trench isolation regions 12. The subcollector 18 may be formed beneath the top surface of the substrate 10 by introducing an electrically-active dopant, such as a dopant from Group V of the Periodic Table (e.g., phosphorus (P), arsenic (As), and/or antimony (Sb)) to provide n-type conductivity. In an embodiment, the subcollector 18 may be formed by a masked high-current ion implantation of a dose of the dopant followed by a high-temperature thermal anneal.

A base layer 22 is formed as a continuous film over the active regions 14, the trench isolation regions 12, and the collector contact region 20. The base layer 22 may include multiple sections 48 including multiple layers 24, 26, 28 containing single-crystal semiconductor material that are stacked and positioned in vertical alignment with one of the active regions 14 and that directly contact the single-crystal semiconductor material of the respective active region 14. The base layer 22 may further include multiple sections 50 having multiple layers 25, 27, 29 containing polycrystalline semiconductor material that are stacked and arranged primarily over a top surface 13 of one of the trench isolation regions 12 and that respectively adjoin the single-crystal layers 24, 26, 28.

The single-crystal layer 24 in the sections 48 of the base layer 22 is continuous with the polycrystalline layer 25 in the sections 50 of the base layer 22, the single-crystal layer 26 in the sections 48 of the base layer 22 is continuous with the polycrystalline layer 27 in the sections 50 of the base layer 22, and the single-crystal layer 28 in the sections 48 of the base layer 22 is continuous with the polycrystalline layer 29 in the sections 50 of the base layer 22. Although the thicknesses of the base layer 22 in sections 48 and sections 50 are shown as being equal, these thicknesses may differ. The transitions between the polycrystalline layers 25, 27, 29 in each section 50 of the base layer 22 and the single-crystal layers 24, 26, 28 in the adjacent sections 48 of the base layer 22 occur along respective interfaces, which are diagrammatically indicated by the dashed lines. Although the interfaces are shown as vertically oriented, the interfaces may be inclined at an angle that is less than 90° or greater than 90°. Each of the interfaces is arranged directly over an interface 21 along which each trench isolation region 12 adjoins one of the active regions 14.

The single-crystal layers 26 and polycrystalline layers 27 of the base layer 22 may be composed of a semiconductor material, such as silicon-germanium (SiGe) including silicon (Si) and germanium (Ge) combined in an alloy with the silicon content ranging from 95 atomic percent to 50 atomic percent and the germanium content ranging from 5 atomic percent to 50 atomic percent. The germanium content of the single-crystal layers 26 and polycrystalline layers 27 of the base layer 22 may be uniform across their respective thicknesses or may be graded and/or stepped across their respective thicknesses. The single-crystal layers 24 and polycrystalline layers 25 of the base layer 22 may be composed of semiconductor material that lacks germanium and, in an embodiment, may be composed entirely of silicon (Si). Similarly, the single-crystal layers 28 and polycrystalline layers 29 of the base layer 22 may be composed of semiconductor material that lacks germanium and, in an embodiment, may be composed entirely of silicon (Si). In an alternative embodiment, the layers 24, 25 of the base layer 22 and the layers 28, 29 of the base layer 22 may have a germanium content (e.g., 1 atomic percent) that is significantly less than the germanium content of the layers 26, 27 of the base layer 22.

The base layer 22 may be formed using a low temperature epitaxial growth process that is non-selective, such as rapid thermal chemical vapor deposition (RTCVD), and during which the composition of the base layer 22 is modulated through control over the deposition conditions. Single-crystal semiconductor material (e.g., single-crystal silicon and/or single-crystal silicon-germanium) epitaxially grows in the stacked single-crystal layers 24, 26, 28, which are disposed in sections 48 and on one of the active regions 14. Polycrystalline semiconductor material forms in the stacked polycrystalline layers 25, 27, 29, which are disposed in sections 50 and arranged over the trench isolation regions 12. The crystal structure of the single-crystal semiconductor material of the active regions 14 serves as a crystalline template for the growth of the single-crystal layers 24, 26, 28 of the base layer 22 as the composition is modulated during growth, whereas the trench isolation regions 12 do not provide any type of crystalline template resulting in the formation of the polycrystalline layers 25, 27, 29 of the base layer 22. In an embodiment, the base layer 22 may be doped with a concentration of a p-type dopant from Group III of the Periodic Table (e.g., boron (B) and/or indium (In)) to provide p-type conductivity and may be in-situ doped during epitaxial growth.

Figure 2:
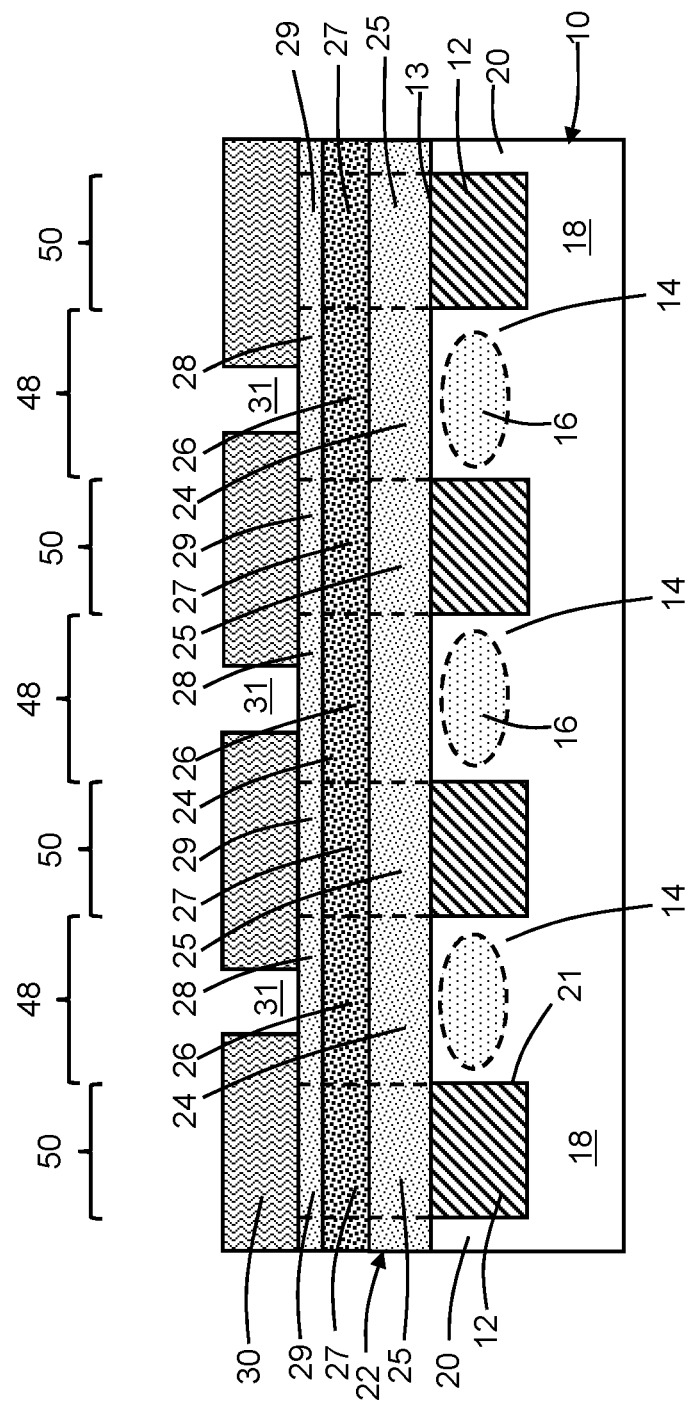

With reference to FIG. 2 in which like reference numerals refer to like features in FIG. 1 and at a subsequent fabrication stage of the processing method, one or more dielectric layers 30 may be formed on the base layer 22 and patterned using photolithography and etching processes to define emitter windows 31. Each emitter window 31 is aligned with the single-crystal layers 24, 26, 28 of the base layer 22 in one of the sections 48.

Figure 3:
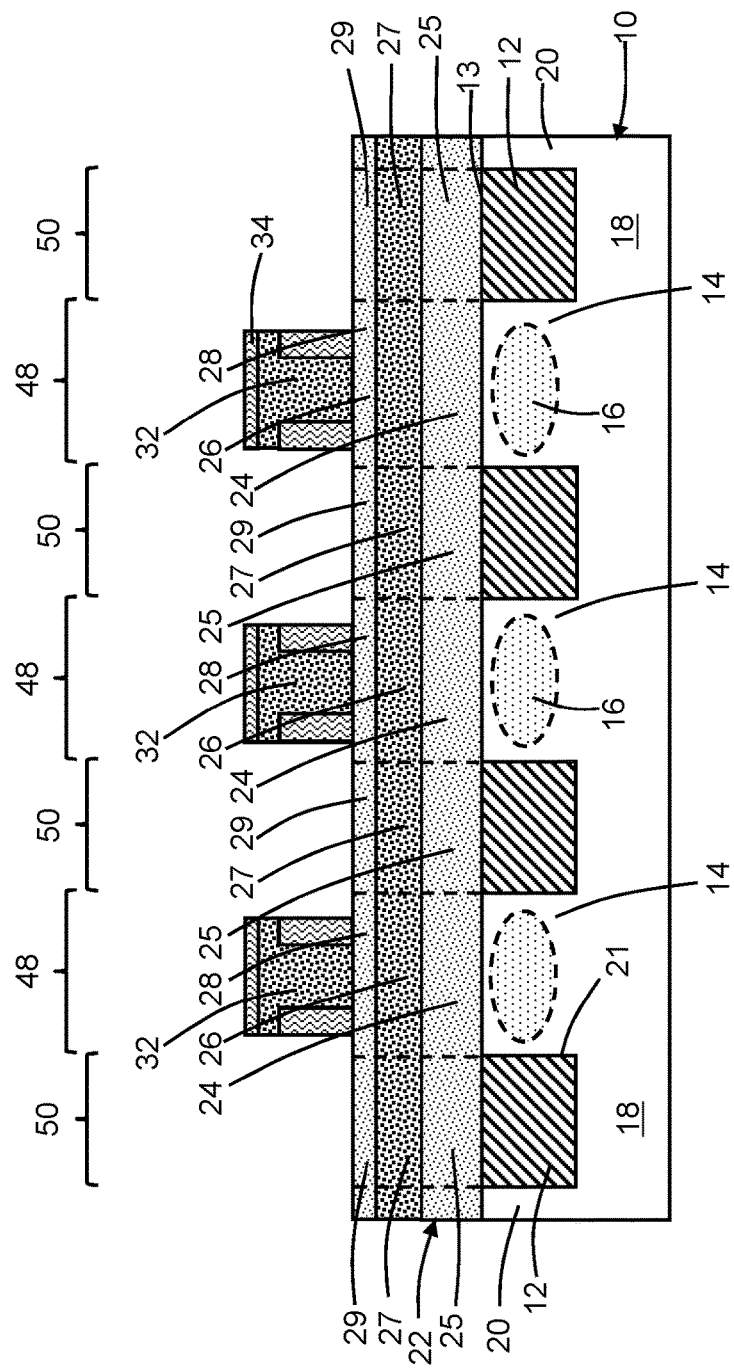

With reference to FIG. 3 in which like reference numerals refer to like features in FIG. 2 and at a subsequent fabrication stage of the processing method, emitter fingers 32 and associated emitter caps 34 are formed by depositing a semiconductor layer that fills the emitter windows 31 and covers the dielectric layers 30, depositing a cap layer on the deposited semiconductor layer, forming an etch mask that masks these deposited layers over the emitter window 31, and etching with reactive ion etching (ME) to pattern the emitter fingers 32 and emitter caps 34. The emitter fingers 32 may contain a polycrystalline semiconductor material, such as polycrystalline silicon (Si), deposited by chemical vapor deposition (CVD). In an embodiment, the semiconductor material constituting the emitter fingers 32 may be doped with a concentration of an n-type dopant from Group V of the Periodic Table (e.g., phosphorus (P) and/or arsenic (As)) to provide n-type conductivity. The emitter caps 34 may be composed of a dielectric material, such as silicon nitride ($Si_3N_4$). The number of active regions 14 and emitter fingers 32 may vary depending on device design.

The polycrystalline layers 27, 29 in the sections 50 of the base layer 22 may be implanted with ions delivering a p-type dopant from Group V of the Periodic Table (e.g., boron (B) and/or indium (In)) under given implantation conditions (e.g., ion species, dose, kinetic energy, implantation angle) and annealed to activate the dopant. The implantation of the polycrystalline layers 27, 29 may provide the heterojunction bipolar transistor with a low-resistance extrinsic base that can be used in subsequent fabrication stages for base contact formation.

Figure 4:
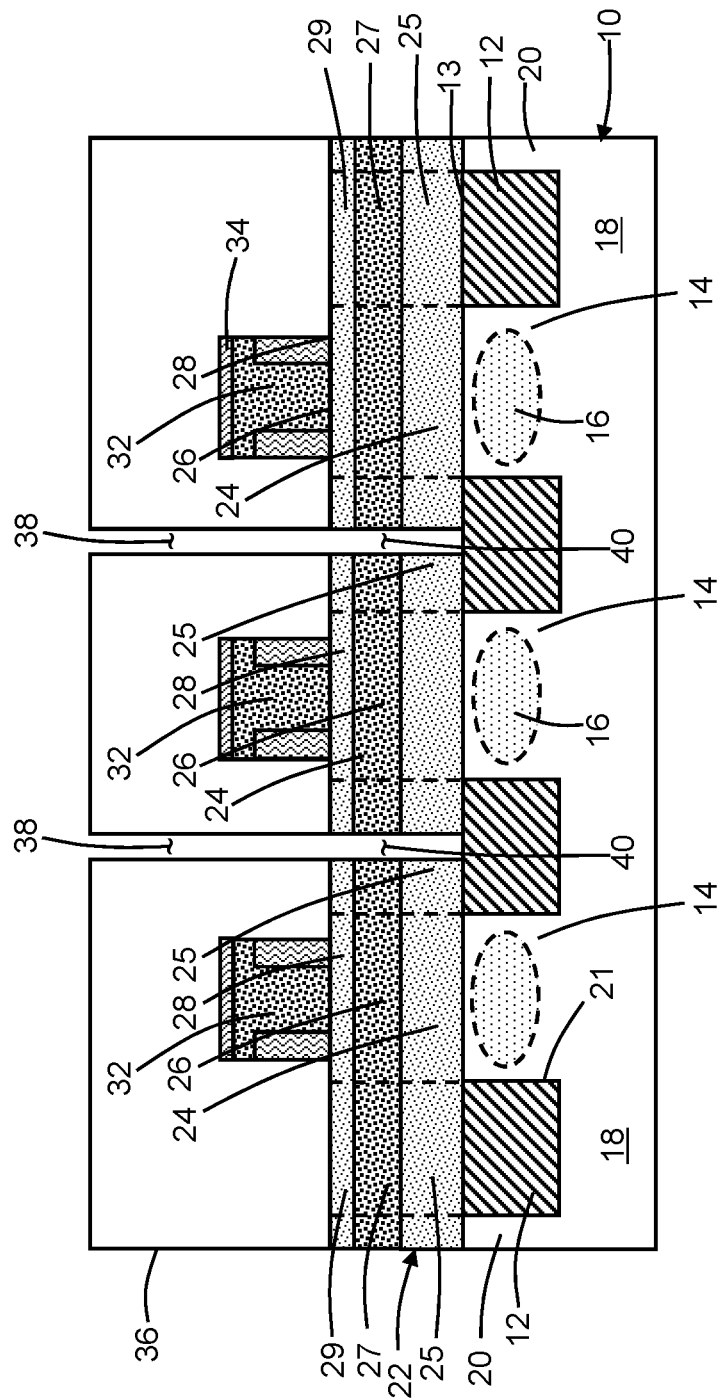
Figure 4A:
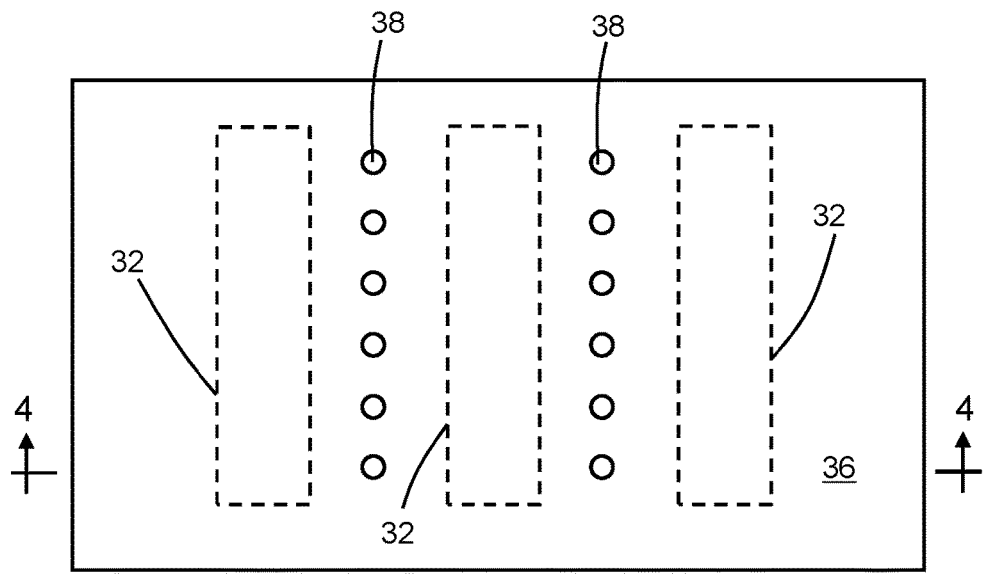

With reference to FIGS. 4, 4A in which like reference numerals refer to like features in FIG. 3 and at a subsequent fabrication stage of the processing method, an etch mask 36 is applied and patterned by lithography to define a plurality of openings 38 that are aligned with the sections 50 (FIG. 1) of the base layer 18, which are arranged between adjacent emitter fingers 32 and over the trench isolation regions 12. Openings 40 are subsequently etched that extend through the polycrystalline layers 25, 27, 29 of the base layer 22 in each section 50 of the base layer 22. In an embodiment, the openings 40 extend completely through the polycrystalline layers 25, 27, 29 of the base layer 22 to the particular trench isolation region 12 underlying each of the sections 50 of the base layer 22. The openings 40 are arranged between adjacent pairs of the emitter fingers 32. The openings 40 penetrating through the polycrystalline layers 25, 27, 29 of the base layer 22 will acquire the shape, size, arrangement, etc. of the openings 38 in the etch mask 36. The etching process forming the openings 40 extending through the polycrystalline layers 25, 27, 29 of the base layer 22 may be an anisotropic reactive ion etching (ME) process that forms vertical or nearly vertical sidewalls.

Figure 4B:
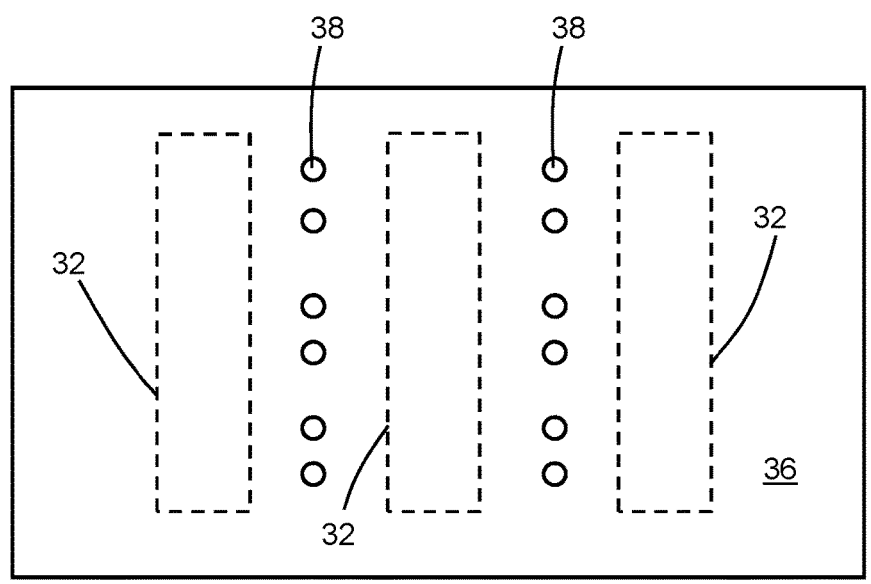
FIGS. 4B and 4C are top views similar to FIG. 4 of etch masks in accordance with alternative embodiments of the invention.
Figure 4C:
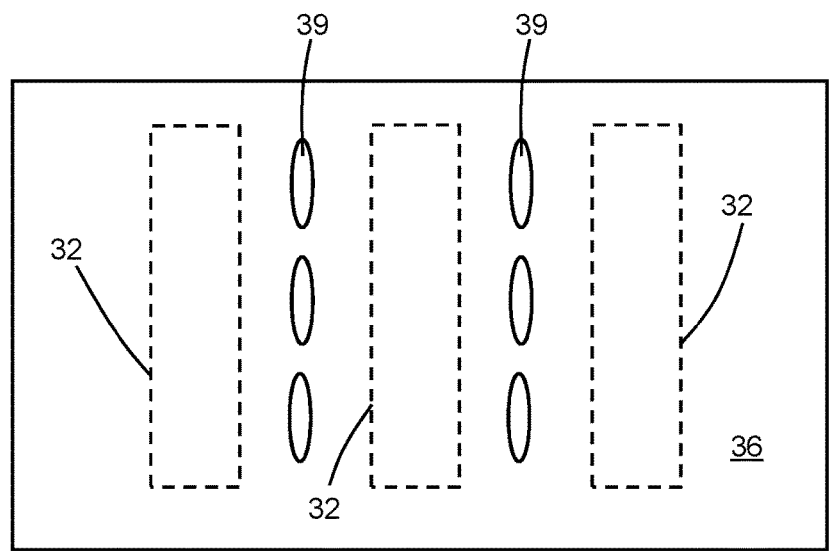

The openings 38 in the etch mask 36 and the openings 40 in the polycrystalline layers 25, 27, 29 may have different shapes and arrangements. As shown in FIG. 4A, the openings 38, 40 may be arranged in a row in which the openings 38 have equal spacing. Alternatively and as shown in FIG. 4B, the openings 38, 40 may be arranged in a row in which the openings 38 are arranged in pairs having equal spacing. Alternatively and as shown in FIG. 4C, equally-spaced slots 39 may be formed instead of the openings 38 and may also be arranged in a row in which the slots 39 have equal spacing. The openings 40 formed in the polycrystalline layers 25, 27, 29 will acquire the oblong shape of the slots 39. In alternative embodiments, different combinations of these shapes and arrangements of openings 38 and/or slots 39 may be selected. The particular choice of a shape and an arrangement of openings 38 and/or slots 39 may depend on factors such as process efficiency, robustness, and ease of manufacturing.

Figure 5:
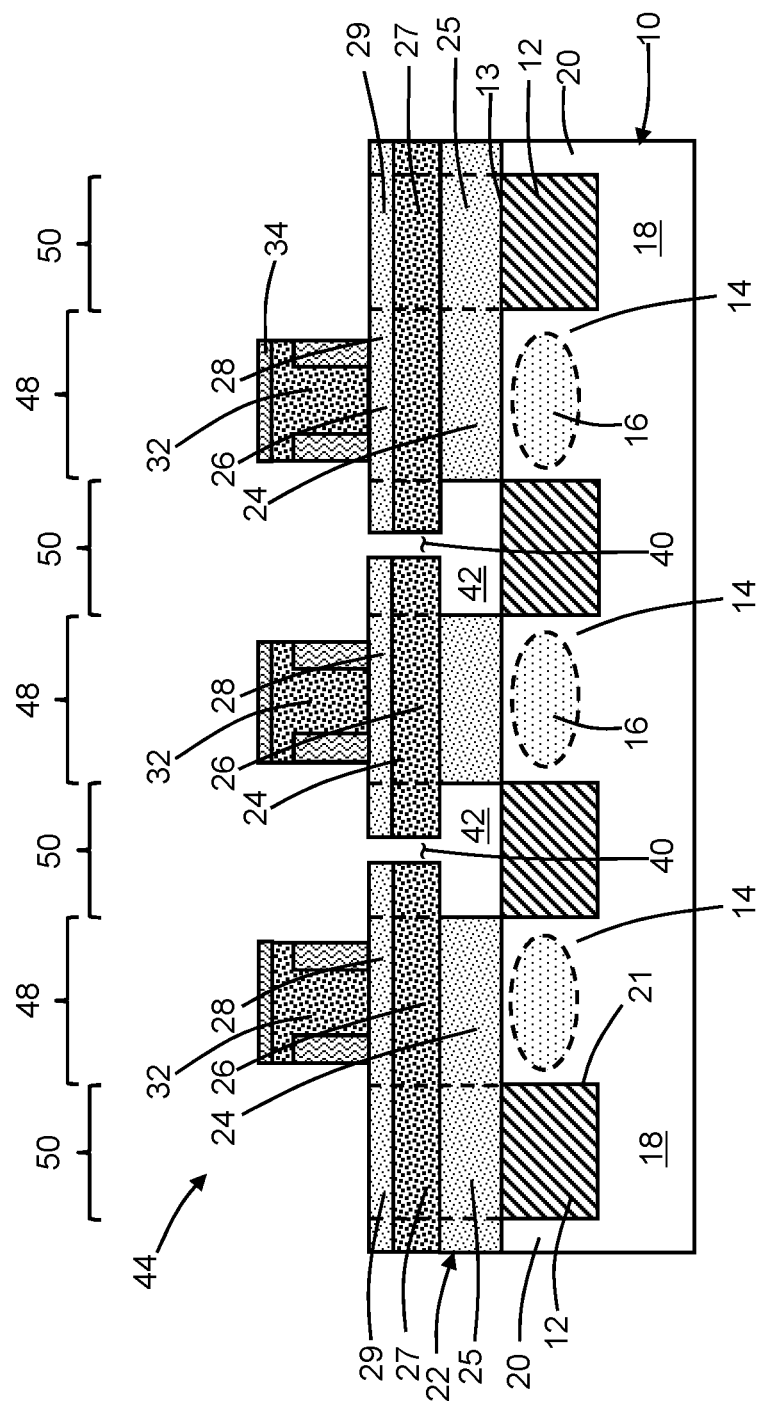
Figure 5A:
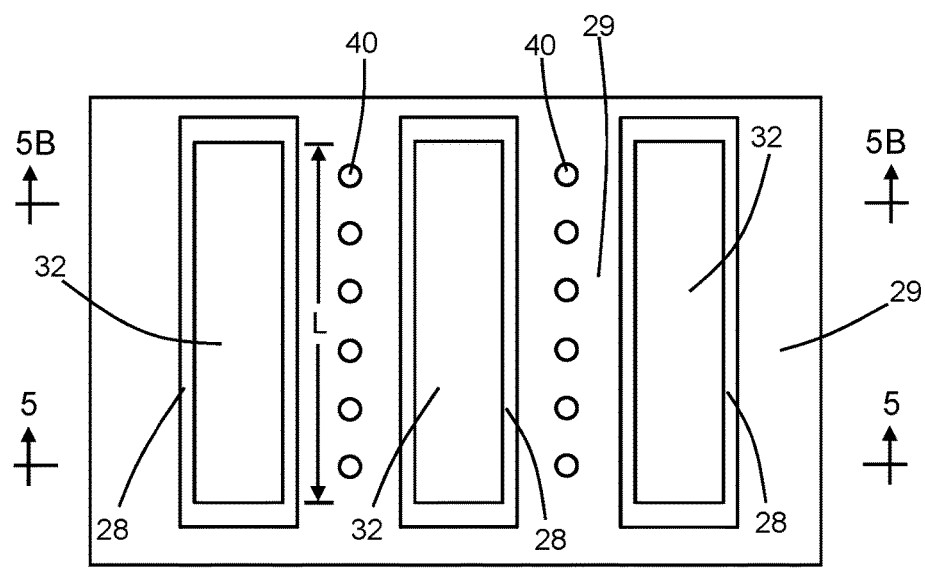
Figure 5B:
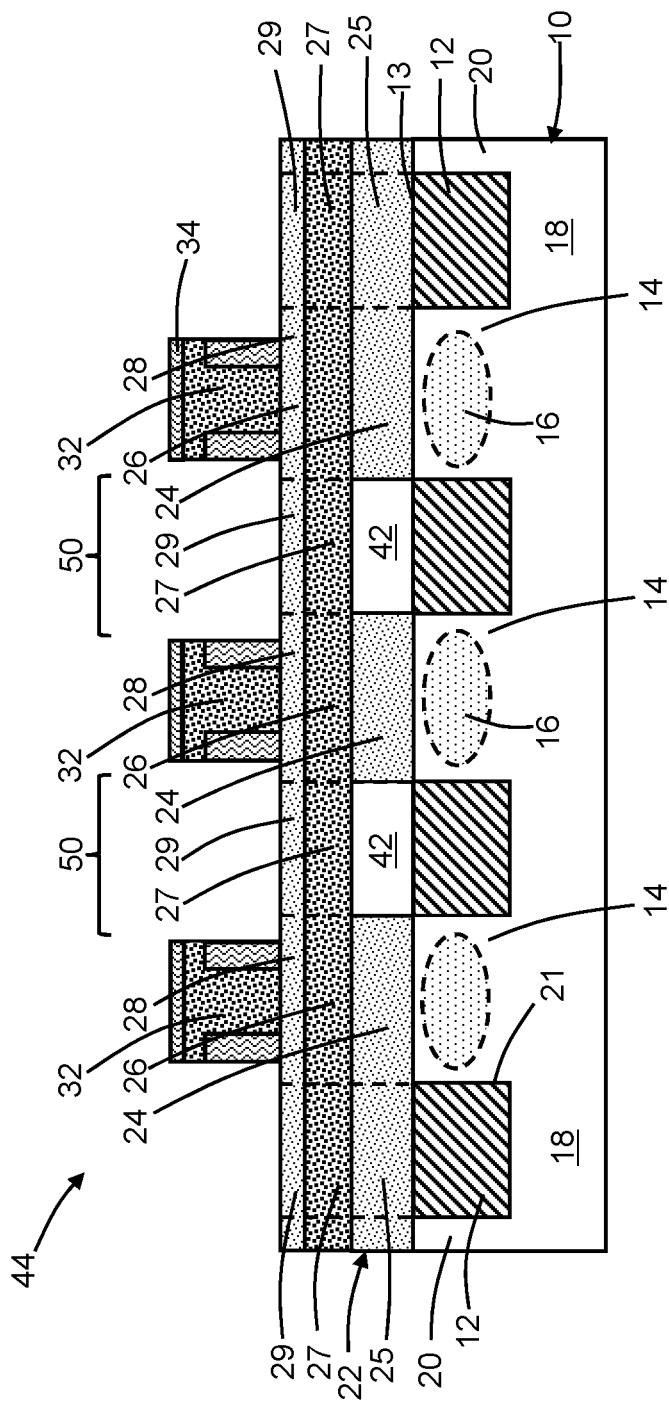
FIG. 5B is a cross-sectional view of the device structure taken generally along line 5B-5B in FIG. 5A.

With reference to FIGS. 5, 5A, 5B in which like reference numerals refer to like features in FIG. 4 and at a subsequent fabrication stage of the processing method, the polycrystalline layer 25 of the base layer 22 may be removed from each of the sections 50 in which the polycrystalline layers 25, 27, 29 are perforated by the openings 38 with an isotropic etching process. The etch chemistry of the isotropic etching process is selected to remove the semiconductor material constituting the polycrystalline layer 25 of the base layer 22 selective to the semiconductor materials constituting the polycrystalline layer 27 of the base layer 22 and the polycrystalline layer 29 of the base layer 22. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The etch mask 36 may be removed subsequent to the performance of the isotropic etch process.

In an embodiment, the isotropic etching process etching and removing the polycrystalline layer 25 in each section 50 of the base layer 22 may be a wet chemical etching process. In an embodiment, the polycrystalline layers 25 may be etched and removed using a basic solution containing a base substance, such as, for example, potassium hydroxide (KOH) or ammonium hydroxide ($NH_4OH$). The polycrystalline layer 27 in each section 50 of the base layer 22 is not etched by the wet chemical etching process because of the compositional difference arising from its germanium content, and the polycrystalline layer 29 in each section 50 of the base layer 22 is not etched by the wet chemical etching process because of its p-type doping and/or its lack of a germanium content. The retention of the polycrystalline layers 29 in the sections 50 of the base layer 22 may ensure that a low base resistance is maintained. In an embodiment, the polycrystalline layer 27 in each section 50 of the base layer 22 can also be partially etched if the concentration of germanium in its composition is low. The etching process may be timed, and the single-crystal layer 24 in each section 48 of the base layer 22 is either not etched or only negligibly etched because of a lower etch rate for its single-crystal semiconductor material in comparison with polycrystalline semiconductor material of the same composition in polycrystalline layer 25.

The removal of the polycrystalline layer 25 in each section 50 of the base layer 22 forms cavities 42 that have a height equal to the thickness of the removed polycrystalline layers 25. The cavities 42 have a length, L, that extends along the length of the emitter fingers 32. The polycrystalline layers 27, 29 in sections 50 of the base layer 22 define bridges of semiconductor material that are undercut by the cavities 42.

The device structure of the resulting heterojunction bipolar transistor 44 has a vertical architecture that includes the sections of the collector 16, the emitter fingers 32, and intrinsic base regions provided by the single-crystal semiconductor material of the single-crystal layers 24, 26, 28 in the sections 48 of the base layer 22. Each intrinsic base region is arranged in a vertical direction between one of the emitter fingers 32 and the collector 16 in the corresponding active region 14 to define respective p-n junctions of the heterojunction bipolar transistor 44.

The extrinsic base of the heterojunction bipolar transistor 44 includes the polycrystalline layers 27, 29 in each section 50 of the base layer 22, which are undercut by one of the cavities 42 and are arranged over one of the trench isolation regions 12. The cavities 42 are arranged in the vertical direction between the trench isolation regions 12 and the undercut sections 50 of the base layer 22 with the polycrystalline layer 27 arranged between polycrystalline layer 29 and the cavity 42. The height of the cavities 42 may be approximately equal to the thickness of the removed portion of the polycrystalline layer 25 of the base layer 22, and may be greater than or equal to the thickness of the single-crystal layers 24 of the base layer 22. The preservation of the polycrystalline layers 27, 29 of the base layer 22 over the cavities 42 due to the selective etching process provides the portion of the extrinsic base undercut by the cavities 42 with a defined thickness.

Figure 6:
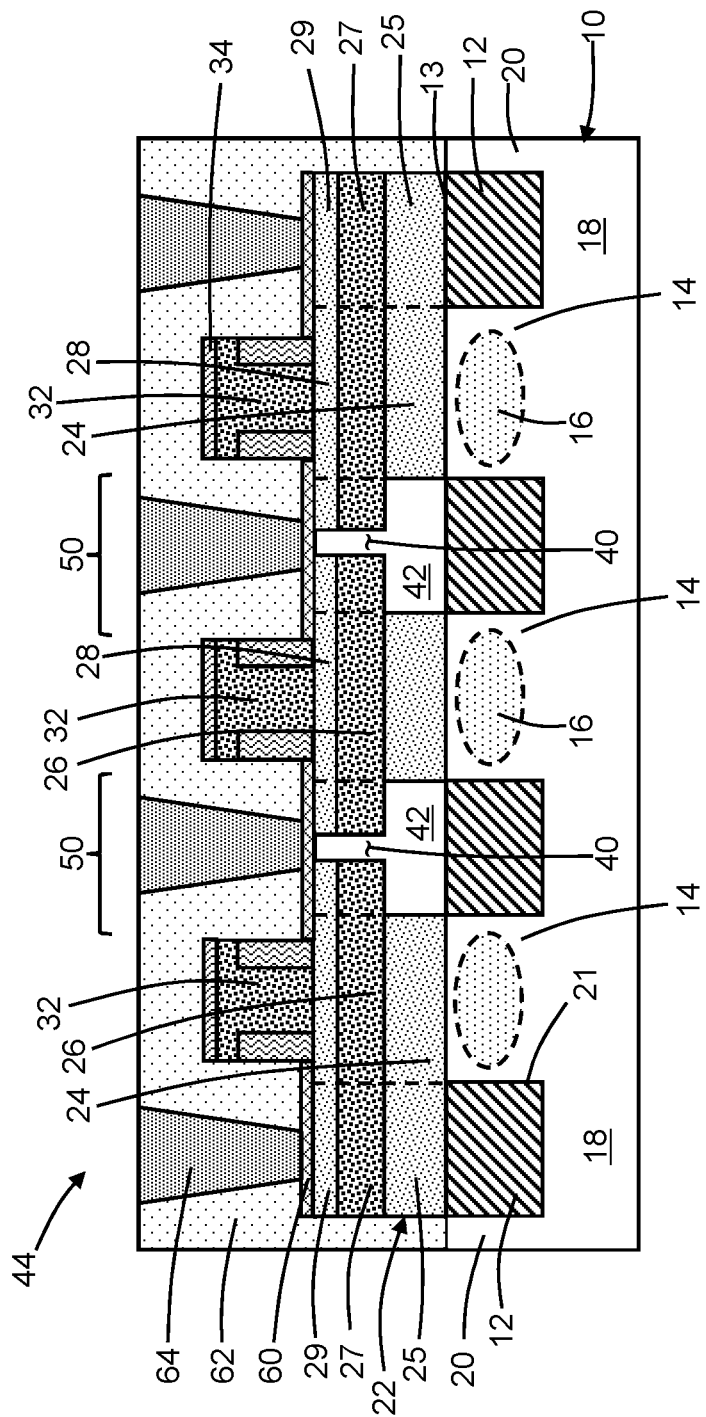

With reference to FIG. 6 in which like reference numerals refer to like features in FIG. 5 and at a subsequent fabrication stage of the processing method, middle-of-line (MOL) processing and back-end-of-line (BEOL) processing follow, which includes formation of contacts, vias, and wiring for an interconnect structure coupled with the heterojunction bipolar transistor 44. As part of this processing, a silicide layer 60 may be formed on the polycrystalline layer 29 of the intact sections 50 of the base layer 22 providing bridges between the openings 40 and surrounding the openings 40, and an interlayer dielectric layer 62 is formed over the heterojunction bipolar transistor 44. The silicide layer 60 may close the openings 40 leading to the cavities 42. The interlayer dielectric layer 62 may contain a dielectric material, such as an oxide of silicon (e.g., silicon dioxide ($SiO_2$)), deposited by chemical vapor deposition (CVD) and planarized. Contacts 64 are formed by patterning contact openings formed in the interlayer dielectric layer 62 with a lithography and etching process, followed by filling the contact openings with a conductor, such as tungsten (W).

Figure 7:
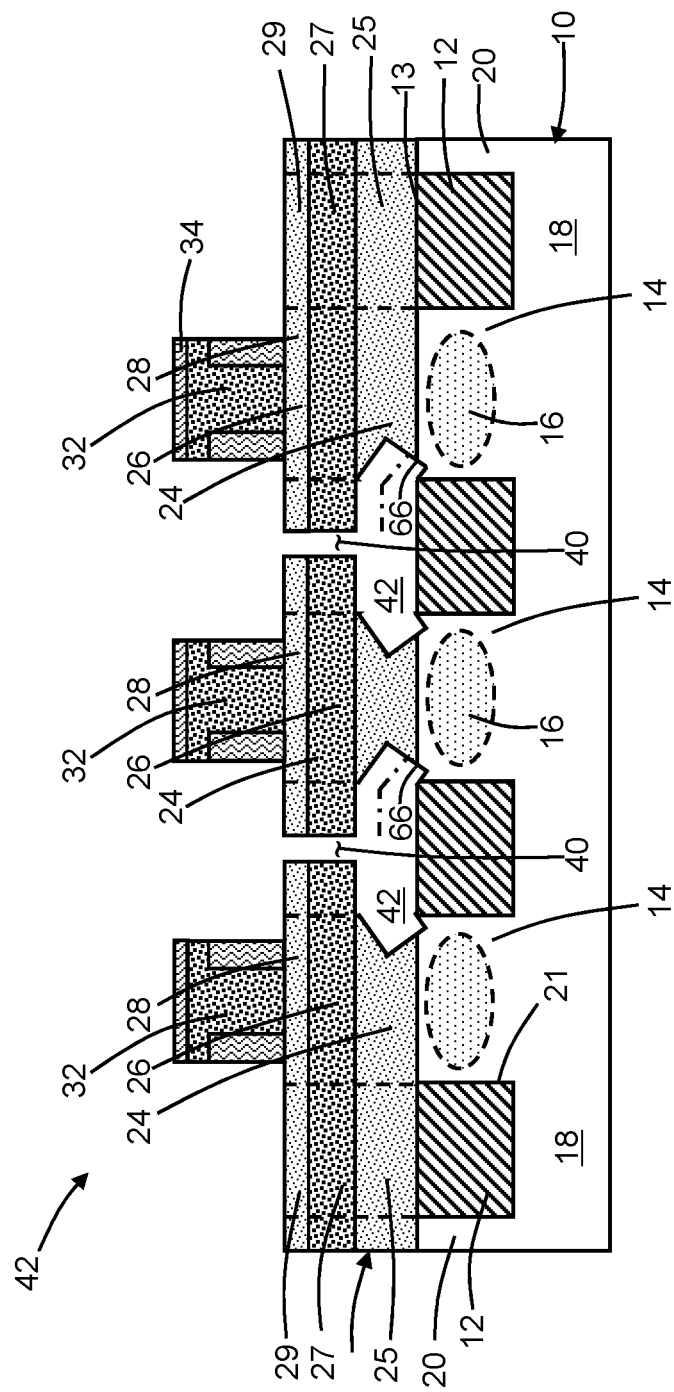
FIG. 7 is a cross-sectional view of the device structure of FIG. 5 in accordance with alternative embodiments of the invention.

With reference to FIG. 7 in which like reference numerals refer to like features in FIG. 6 and in accordance with alternative embodiments, the isotropic etching process may be lengthened to further enlarge each cavity 42 by removing part of the single-crystal semiconductor material of the single-crystal layer 24 of the base layer 22 and part of the single-crystal semiconductor material of the active region 14. In an embodiment, the isotropic etching process forming the cavities 42 may exhibit a crystallographic orientation dependent in which the kinetics of the etching process may vary according to crystal plane and, in particular, may vary for different low-index crystal planes. Due to these variations in its kinetics, the isotropic etching process may form angled surfaces 66 in (111) planes in the single-crystal semiconductor materials of the single-crystal layer 24 of the base layer 22 and the active region 14, and may proceed at an etch rate in the single-crystal semiconductor materials of the single-crystal layer 24 of the base layer 22 that is less than the etch rate of the polycrystalline layer 25 of the base layer 22.

Each cavity 42 includes a section arranged over one of the trench isolation regions 12 that may have a uniform height and that extends beneath the polycrystalline layers 27, 29 of the base layer 22 (i.e., the extrinsic base) to the interface 19. Each cavity 42 also includes a section that may have a uniform height and that is angled or inclined relative to the section beneath the polycrystalline layers 27, 29 of the base layer 22 toward the active region 14. The change in the orientation of the centerline of the sections of each cavity 42 is indicated by the dot-dashed lines in FIG. 7. The angled section of each cavity 42 extends, in part, into single-crystal layer 26 of the base layer 22 and, in part, into the single-crystal semiconductor material of the active region 14 to a depth that is below the top surface 13 of the trench isolation regions 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "above" and "below" indicate positioning of elements or structures relative to each other and/or to the top surface of a semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a heterojunction bipolar transistor, the device structure comprising:
   a plurality of trench isolation regions arranged to surround a plurality of active regions;
   a collector in each of the active regions;
   a base layer including a plurality of first sections that are respectively arranged over the active regions and a plurality of second sections that are respectively arranged over the trench isolation regions, the first sections of the base layer contain single-crystal semiconductor material, the second sections of the base layer contain polycrystalline semiconductor material, and the second sections of the base layer spaced in a vertical direction from the trench isolation regions to define a plurality of cavities; and
   a plurality of emitter fingers respectively arranged on the first sections of the base layer.

2. The device structure of claim 1 wherein each of the second sections of the base layer includes a silicon-germanium layer that is arranged over one of the trench isolation regions.

3. The device structure of claim 2 wherein each of the second sections of the base layer includes a silicon layer that is arranged over the silicon-germanium layer of one of the second sections of the base layer.

4. The device structure of claim 2 wherein each of the first sections of the base layer includes a silicon-germanium layer that is arranged directly over one of the active regions and that laterally adjoins the silicon-germanium layer of one or more of the first sections of the base layer.

5. The device structure of claim 1 wherein each of the first sections of the base layer includes a silicon layer on one of the active regions, and each of the cavities extends beneath one of the second sections of the base layer to the silicon layer of one of the first sections of the base layer.

6. The device structure of claim 5 wherein the silicon layer of each first section of the base layer has a thickness, and the cavities have a height that is greater than or equal to the thickness of the silicon layer of each first section of the base layer.

7. The device structure of claim 1 wherein the first sections of the base layer and the second sections of the base layer adjoin along a plurality of first interfaces, the trench isolation regions adjoin the active regions along a plurality of second interfaces, and each of the first interfaces is arranged directly over one of the second interfaces.

8. The device structure of claim 1 wherein each of the first sections of the base layer includes a silicon layer arranged on one of the active regions, and each of the cavities includes a first section that extends beneath one of the second sections of the base layer to the silicon layer of one of the first sections of the base layer and a second section that extends into the silicon layer of one of the first sections of the base layer and one of the active regions.

9. The device structure of claim 8 wherein the second section of each cavity is angled relative to the first section of each cavity.

10. The device structure of claim 9 wherein each of the trench isolation regions has a top surface, and the second section of each cavity extends to a depth that is below the top surface of each trench isolation region.

11. The device structure of claim 1 wherein each of the second sections of the base layer include a plurality of openings, and the openings extend through the second sections of the base layer to the cavities.

12. The device structure of claim 1 further comprising:
an interlayer dielectric layer over the heterojunction bipolar transistor; and
a plurality of contacts extending through the interlayer dielectric layer to the second sections of the base layer.

13. A method of forming a heterojunction bipolar transistor, the method comprising:
forming a plurality of trench isolation regions surrounding a plurality of active regions that each include a collector;
forming a base layer that includes a plurality of first sections containing single-crystal semiconductor material that are respectively arranged over the active regions and a second plurality of sections containing polycrystalline semiconductor material that are respectively arranged over the trench isolation regions;
removing a first semiconductor layer of each of the second sections of the base layer selective to a second semiconductor layer of each of the second sections of the base layer to define a plurality of cavities that are arranged in a vertical direction between the second semiconductor layer and the trench isolation regions; and
forming a plurality of emitters respectively arranged on the first sections of the base layer.

14. The method of claim 13 wherein removing the first semiconductor layer of each of the second sections of the base layer selective to the second semiconductor layer of each of the second sections of the base layer comprises:

forming a plurality of openings that extend through each of the second sections of the base layer to the trench isolation regions.

15. The method of claim 14 wherein removing the first semiconductor layer of each of the second sections of the base layer selective to the second semiconductor layer of each of the second sections of the base layer further comprises:
after the openings are formed in each second section, isotropically etching the first semiconductor layer.

16. The method of claim 15 wherein the first semiconductor layer is isotropically etched with a wet chemical etching process.

17. The method of claim 16 wherein the first semiconductor layer is comprised of silicon, and the second semiconductor layer is comprised of silicon germanium.

18. The method of claim 16 wherein the first semiconductor layer is completely removed by the wet chemical etching process.

19. The method of claim 13 wherein each of the first sections of the base layer includes a silicon layer on the respective active region, each of the cavities includes a first section that extends beneath the respective second section of the base layer, and further comprising:
forming a second section of each cavity that extends into the silicon layer of the first section of the base layer and the respective active region,
wherein the second section of each cavity is angled relative to the first section of each cavity.

20. The method of claim 13 wherein each of the second sections of the base layer includes a third semiconductor layer that is arranged over the second semiconductor layer, the first semiconductor layer has a first conductivity type, and further comprising:
doping the third semiconductor layer of each of the second sections of the base layer to have a second conductivity type,
wherein the first semiconductor layer of each of the second sections of the base layer is removed selective to the third semiconductor layer of each of the second sections of the base layer.

* * * * *

UNITED STATES PATENT AND TRADEMARK OFFICE
CERTIFICATE OF CORRECTION

PATENT NO. : 10,312,356 B1
APPLICATION NO. : 16/013363
DATED : June 4, 2019
INVENTOR(S) : Qizhi Liu et al.

Page 1 of 1

It is certified that error appears in the above-identified patent and that said Letters Patent is hereby corrected as shown below:

In the Specification
At Column 2, Line number 26, change "FIG. 4" to --FIG. 4A--
At Column 5, Line number 4, change "18" to --22--

In the Claims
At Column 8, Claim No. 4, Line number 46, change "first" to --second--

Signed and Sealed this
Twenty-ninth Day of October, 2019

Andrei Iancu
*Director of the United States Patent and Trademark Office*